United States Patent
Schober

(10) Patent No.: US 8,659,132 B2
(45) Date of Patent: Feb. 25, 2014

(54) MICROELECTRONIC PACKAGE ASSEMBLY, METHOD FOR DISCONNECTING A MICROELECTRONIC PACKAGE

(75) Inventor: Joachim Heinz Schober, Graz (AT)

(73) Assignee: NXP B.V., Eindhoven (NL)

( * ) Notice: Subject to any disclaimer, the term of this patent is extended or adjusted under 35 U.S.C. 154(b) by 272 days.

(21) Appl. No.: 13/126,045

(22) PCT Filed: Oct. 13, 2009

(86) PCT No.: PCT/IB2009/054497
§ 371 (c)(1),
(2), (4) Date: Apr. 26, 2011

(87) PCT Pub. No.: WO2010/049835
PCT Pub. Date: May 6, 2010

(65) Prior Publication Data
US 2011/0204503 A1  Aug. 25, 2011

(30) Foreign Application Priority Data
Oct. 27, 2008 (EP) .................... 08105672

(51) Int. Cl.
*H01L 23/495* (2006.01)
(52) U.S. Cl.
USPC ....... 257/676; 257/48; 257/686; 257/E21.521
(58) Field of Classification Search
USPC .............. 257/666, 676, 48, E21.521
See application file for complete search history.

(56) References Cited

U.S. PATENT DOCUMENTS

| 3,484,533 | A | | 12/1969 | Kauffman |
| 3,714,370 | A | | 1/1973 | Nixen et al. |
| 4,089,575 | A | * | 5/1978 | Grabbe ..................... 439/71 |
| 4,224,637 | A | * | 9/1980 | Hargis ..................... 257/670 |
| 5,233,220 | A | | 8/1993 | Lamson et al. |
| 5,791,042 | A | * | 8/1998 | Baum et al. ............... 29/830 |
| 5,841,187 | A | | 11/1998 | Sugimoto et al. |
| 6,351,883 | B1 | | 3/2002 | Beaumont |
| 6,436,736 | B1 | | 8/2002 | Embong et al. |
| 6,475,827 | B1 | | 11/2002 | Lee et al. |
| 6,689,640 | B1 | | 2/2004 | Mostafazadeh |
| 2004/0113248 | A1 | * | 6/2004 | Ito et al. ..................... 257/678 |
| 2005/0287709 | A1 | | 12/2005 | Lee et al. |
| 2007/0164402 | A1 | | 7/2007 | Jung et al. |

FOREIGN PATENT DOCUMENTS

JP 11 330335 A 11/1999

OTHER PUBLICATIONS

International Search Report and Written Opinion for Application PCT/IB2009/054497 (Feb. 15, 2010).

* cited by examiner

*Primary Examiner* — Matthew W Such
*Assistant Examiner* — Abul Kalam

(57) ABSTRACT

A microelectronic package assembly comprises a lead frame having a holding bar (16) and a microelectronic package (14). The microelectronic package (14) comprises a package body (22) and a connecting element (24) for connecting the package body (22) to the holding bar (16) of the lead frame (12). The connecting element (24) extends from an outer surface (26) of the package body (22) and is engaged with an ending part (28) of the holding bar (16).

6 Claims, 1 Drawing Sheet ical package assembly according to an exemplary aspect of the invention that a connection between a package body of a microelectronic package and a holding bar of a lead frame may be accomplished by an engagement of a connecting

MICROELECTRONIC PACKAGE ASSEMBLY, METHOD FOR DISCONNECTING A MICROELECTRONIC PACKAGE

FIELD OF THE INVENTION

The invention refers to a microelectronic package assembly.

Further, the invention relates to a method for disconnecting a microelectronic package from a lead frame.

Furthermore, the invention relates to a method for manufacturing such a microelectronic package assembly.

BACKGROUND OF THE INVENTION

A microelectronic package assembly, a method for disconnecting a microelectronic package from a lead frame, and a method for manufacturing a microelectronic package assembly are known from JP 11-330335 A.

Generally, microelectronic package assemblies are manufactured during industrial mass production of semiconductor chips. Such a microelectronic assembly comprises a lead frame containing a plurality of microelectronic packages. Each microelectronic package generally comprises a semiconductor chip arranged on a substrate, which may be a structural part of the lead frame initially, which both are overmoulded by an encapsulation. The microelectronic packages are connected to the lead frame via holding bars for securing the packages against unintentional movements and via contact leads for electrically connecting the chips of the microelectronic packages to external electronics. The contact leads may also be a structural part of the lead frame initially. After manufacturing the microelectronic assembly, the electronics of the microelectronic packages are tested. For this purpose, the contact leads are disconnected from the lead frame in a punching step. At the same step also the substrate holding the semiconductor chip may be fully or partially disconnected from the lead frame. Subsequently a package singulation step takes place either at the manufacturer or at the costumer in order to provide individual microelectronic packages for further use in electronic devices. During this singulation step, the holding bars of the lead frame are disconnected from the microelectronic packages by e.g. breaking the holding bars away from the package body. The most commonly used singulation process, however, is a separate punching step.

The microelectronic package assembly known from JP 11-330335 A comprises a lead frame and a plurality of encapsulated microelectronic packages which are connected to one another via holding bars. The holding bars are inserted into slits of the package bodies such that the holding bars and the package bodies are engaged to one another. In order to disconnect the packages from the lead frame, the holding bars are receded from the package body using an engagement releasing tool comprising a tapered terminal part. During release, the tapered terminal part is moved in a direction perpendicular to a longitudinal axis of the holding bars such that elastically deformable parts of the holding bars are bent away from the package and the ending part of the holding bars are moved in a direction reverse to the insertion direction. Thus, the microelectronic packages are disconnected from the lead frame.

However, the known methods of disconnecting a microelectronic package may be complex and may lead to a low yield since damages may occur during the singulation step.

OBJECT AND SUMMARY OF THE INVENTION

It may be an objective of the invention to provide a microelectronic package assembly having a high package density. Further, it may be an objective of the invention to provide an improved method for disconnecting a microelectronic package from a lead frame allowing easily disconnecting the microelectronic package from the lead frame without damage of the microelectronic package. Yet further, it may be an objective of the invention to provide a method for manufacturing such a microelectronic package assembly.

In order to achieve the objectives defined above, a microelectronic package assembly, a method for disconnecting a microelectronic package from a lead frame, and a method for manufacturing a microelectronic package assembly according to the independent claims are provided. Advantageous embodiments are described in the dependent claims.

According to an exemplary aspect of the invention, a microelectronic package assembly is provided, comprising a lead frame having a holding bar and a microelectronic package, wherein the microelectronic package comprises a package body and a connecting element for connecting the package body to the holding bar of the lead frame, wherein the connecting element extends from an outer surface of the package body and is engaged with an ending part of the holding bar.

According to another exemplary aspect of the invention, a method for disconnecting a microelectronic package from a lead frame is provided, comprising the steps of providing a microelectronic package assembly according to an exemplary aspect of the invention, and disconnecting the microelectronic package from the holding bar of the lead frame by disconnecting the connection element of the microelectronic package from the ending part of the holding bar of the lead frame.

According to yet another exemplary aspect of the invention, a method for manufacturing a microelectronic package assembly is provided, comprising the steps of providing a lead frame comprising a holding bar, providing a microelectronic chip on a substrate adjacent to an ending part of the holding bar of the lead frame, encapsulating the microelectronic chip and the substrate such that a connecting element is formed at an outer surface of a package body of a microelectronic package which engages with the ending part of the holding bar.

Descriptively seen, an individual microelectronic package disconnected from the lead frame of the microelectronic package assembly comprises a connecting element arranged at its outer surface. The connecting element is designed to come into engagement with a respective ending part of a holding bar of the lead frame. After singulation of the microelectronic packages, the connecting element may be at least partly disconnected from the outer surface of the package body.

It may be seen as a gist of an exemplary aspect of the invention that a connection between a package body of a microelectronic package and a holding bar of a lead frame may be accomplished by an engagement of a connecting element arranged at an outer surface of the package body with an ending part of the holding bar facing the package body. Thus, the holding bar may not penetrate in or even through the package body. Thus, a well defined predetermined breaking point or line may be formed at a connection zone between the connection element and the ending part of the holding bar, which connection zone is spaced apart from the outer surface of the package body.

Advantageously, a microelectronic package assembly may be provided which has a high package density, since the lead frame may be designed in a small and compact way and no further space is required for e.g. allowing bending the holding bar away from the lead frame upon disconnecting the package from the lead frame. Thus, mass production of microelectronic packages may be highly cost-efficient, since less microelectronic package assemblies may be required for providing a predetermined number of microelectronic packages.

Further, the process of manufacturing the microelectronic package assembly may be easily performed, since the connection between the connection element and the ending part of the holding bar may be accomplished during the encapsulation step.

Further, a connection zone between the connecting element and the ending part of the holding bar may define a predetermined breaking point which may be slightly spaced from the package body. Thus, when disconnecting the microelectronic package from the lead frame the risk of damaging the package body or encapsulation material may advantageously be reduced, thereby guaranteeing functionality and high quality of the microelectronic packages despite the mass production of the microelectronic packages.

Further, singulation of the microelectronic packages may be easily performed owing to the type of connection between the microelectronic packages and the holding bars of the lead frame. Thus, investment and maintenance costs of the singulating tool may advantageously be low since no constructively complex singulating tool is required during the singulating step.

Next, further aspects of exemplary embodiments of the microelectronic package assembly are described. However, these embodiments also apply for the method for disconnecting a microelectronic package and to the method for manufacturing such a microelectronic package assembly.

According to an exemplary embodiment of the microelectronic package assembly, the ending part of the holding bar comprises a profiled face to enable a removable form-fitting or positive locking connection respectively engagement. In particular, the holding bar may be formed as a profiled face. This measure may advantageously enable a secure connection between the connection element and the holding bar such that no damage of the microelectronic package will occur even during shipping the microelectronic assembly to the customer etc. The connecting element may be designed in such a way that it comprises a respective profile which fits to the ending part of the holding bar.

According to another exemplary embodiment of the microelectronic package assembly, the connecting element at least partially surrounds the ending part of the holding bar. In particular, the connecting element may surround the total circumference or half the circumference of the ending part of the holding bar. This measure may advantageously improve the connection between the microelectronic package and the lead frame as the connection stability between the package body and the holding bar may be enhanced. Thus, unintentional movement of the package and the lead frame relative to one another may be avoided.

According to another exemplary embodiment of the microelectronic package assembly, the ending part of the holding bar comprises a projection which extends towards the connecting element. In particular, the projection may be centrally arranged at the front face of the ending part and may extend along a longitudinal axis of the holding bar.

According to another exemplary embodiment of the microelectronic package assembly, the ending part of the holding bar comprises a recess, which is shaped in an inwardly tapered way. In particular, the recess may be conically shaped with an axis of the cone being identical to a longitudinal axis of the holding bar.

These exemplary embodiments of the ending part of the holding bar may advantageously offer the possibility of a particular secure and space-saving connection between the microelectronic package and the lead frame. In particular, vertical and/or horizontal movement of the package body and the holding bar relative to one another may be prevented.

According to another exemplary embodiment of the microelectronic package assembly, the connecting element and an encapsulation of the microelectronic package are monolithically designed. In particular, the connecting element and the encapsulation of the microelectronic package may be made of the same material. Thereby, the manufacturing process of the microelectronic package assembly can significantly simplified, since both the encapsulation and the connecting element may be made during one production step. Further, the microelectronic package may be manufactured at low costs.

According to another exemplary embodiment of the microelectronic package assembly, the connecting element is made of a plastic or a resin. Such materials advantageously may offer a sufficient electrical isolation and resistivity against environmental conditions.

According to another exemplary embodiment of the microelectronic package assembly, two holding bars are provided for each microelectronic package, which are arranged in a diametrically offset way to one another. Thus, each microelectronic package of the microelectronic package assembly may securely be held in place, thereby reducing any risks of damages upon unintentional movements of the microelectronic package. In particular, the holding bars may be arranged at opposite points along the circumference of the microelectronic package.

According to another exemplary embodiment of the invention, in the method of disconnecting a microelectronic package from a lead frame, the disconnecting of the microelectronic package from the holding bar comprises pivoting of the microelectronic package and the lead frame relative to one another around an axis of the holding bar. The pivotal axis may be the longitudinal axis of the holding bar. In particular, the microelectronic package may be pivoted or twisted around the axis of the holding bar, whereas the lead frame may be kept remaining in place.

According to another exemplary embodiment of the invention, in the method of disconnecting the microelectronic package from the lead frame, the disconnecting of the microelectronic package from the holding bar comprises pivoting of the microelectronic package and the lead frame relative to one another around an axis being transverse to the axis of the holding bar. The pivotal axis may be perpendicular to the axis of the holding bar. In particular, the lead frame may be pivoted or bended around the transverse axis, while the microelectronic package remains in place.

In particular, these exemplary disconnecting steps may be applied simultaneously or subsequently. These method embodiments may result in loosening and/or releasing the holding bar from the connecting element, thereby advantageously offering an easy disconnecting procedure without damage of the package body.

Summarizing, according to a first exemplary aspect of the invention, a microelectronic package assembly may be provided having a lead frame and microelectronic packages. The microelectronic assembly may comprise a high package density, wherein the microelectronic packages are easily disconnectable from the lead frame. These effects may be achieved by a special connection between the package body and the holding bar in terms of a further connection element being arranged at the outer surface of the package body and engaging with an ending part of the holding bar.

Summarizing, according to a second exemplary aspect of the invention, a method for disconnecting a microelectronic package from a lead frame is provided, wherein the disconnecting may be performed without damaging the package body. For this purpose, the ending part of the holding bar and a connection element arranged at the outer surface of the package body may define a predetermined breakage point or line.

Summarizing, according to a third exemplary aspect of the invention, a method for manufacturing a microelectronic package assembly may be provided which is cost-efficient, since the connection of the lead frame and the microelectronic packages may be constructively simple. During encapsulation of the microelectronic package a further connection element may be provided at the outer surface of the package body which adapts its shape according to a profiled face of a respective ending part of a holding bar of the lead frame.

The aspects defined above and further aspects of the invention are apparent from the examples of embodiment to be described hereinafter and are explained with reference to these examples of embodiment. It should be noted that features described in connection with one exemplary embodiment or exemplary aspect may be combined with other exemplary embodiments and other exemplary aspects.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
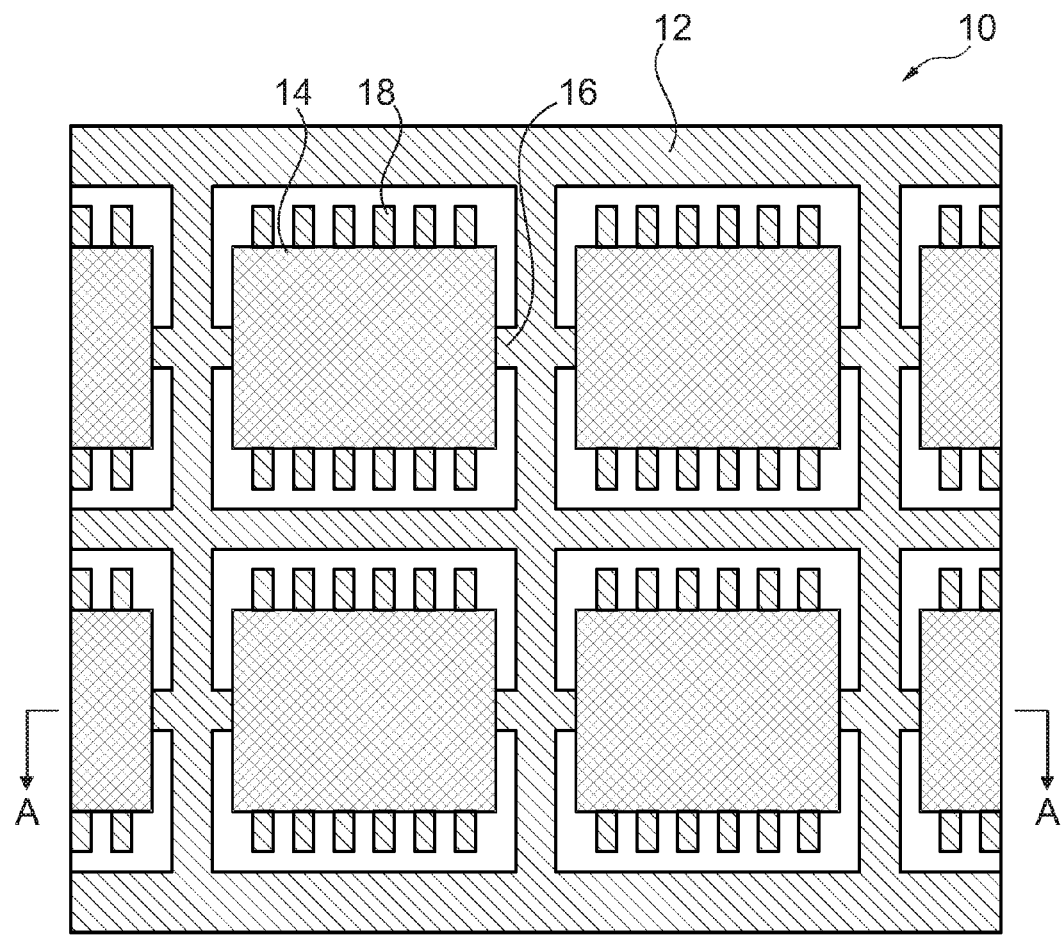
FIG. 1 schematically illustrates a microelectronic package assembly according to the invention.

The illustration in the drawing is schematically. In different drawings, similar or identical elements are provided with similar or identical reference signs.

FIG. 1 schematically shows a plain view of a microelectronic package assembly 10 according to the invention. The microelectronic package assembly 10 may be manufactured during a high volume production of microelectronic packages for electronic devices.

The microelectronic package assembly 10 comprises a lead frame 12 in the form of a square lattice and a plurality of microelectronic packages 14. The microelectronic packages 14 are centrally arranged in openings of the lead frame 12 and are attached to the lead frame 12 via holding bars 16 such that the microelectronic packages 14 are firmly held in place. In particular, each microelectronic package 14 is connected to the lead frame 12 via two holding bars 16 that are arranged at opposite sides of the microelectronic package 14. Contact leads 18 are arranged on those sides of the microelectronic package 14 which are perpendicular to the sides attached to the holding bars 16. The holding bars 16 and the contact leads 18 are arranged in a perpendicular way. The contact leads 18 of the packages 14 are disconnected from the lead frame 12. The released contacts leads 18 may be electrically connected during a testing step of testing the electrical functionality of a semiconductor chip housed inside the microelectronic package 14.

Figures 2, 3:
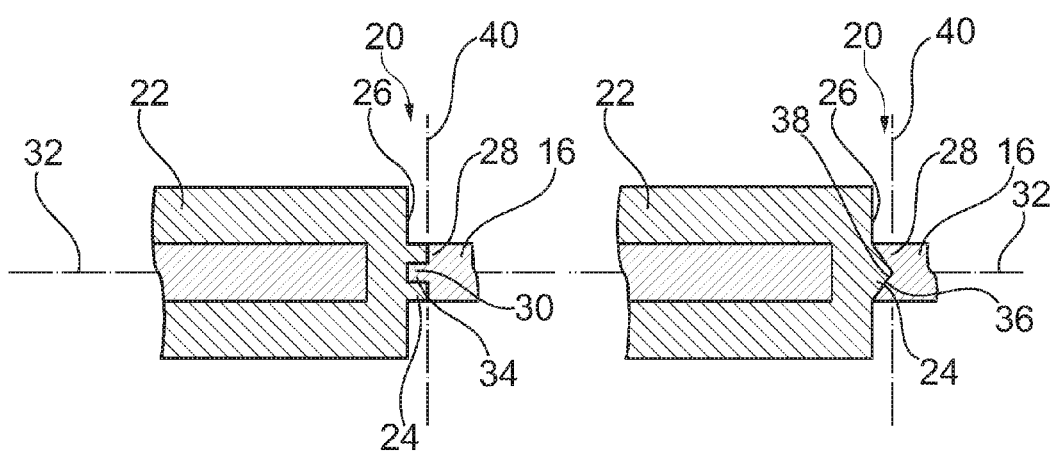
FIG. 2 schematically illustrates an enlarged cross sectional view of an exemplary embodiment of the microelectronic package assembly in FIG. 1 taken along the line A-A.
FIG. 3 schematically illustrates a further enlarged cross sectional view of a further exemplary embodiment of the microelectronic package assembly in FIG. 1 taken along the line A-A.

FIGS. 2 and 3 schematically illustrate an enlarged view of a connection zone 20 between the microelectronic package 14 and the holding bar 18 of the lead frame 12. The microelectronic package 14 comprises a package body 22, which is typically block-shaped. The package body 22 comprises a substrate (not referenced) on which a semiconductor chip (not shown) is placed. An encapsulation is formed around the substrate and the semiconductor chip for protecting the chip against environmental influence. Further, the holding bars 16 comprise an almost rectangular cross section. However, the holding bars 16 may comprise cross sections of any other regular, e.g. of circular or elliptic, or irregular forms.

A connection element 24 is provided at an outer surface 26 of the package body 22. An ending part 28 of the holding bar 16 engages with the connecting element 24 in a tongue and groove like manner respectively in such a way that the holding bar 16 butts against the package body 22 and/or a front side of the connecting element 24. Therefore, the ending part 28 of the holding element 16 does not penetrate into the package body 22. In order to ensure a secure connection between the package body 20 and the holding bar 16, the ending part 28 of the holding bar 16 comprises a profiled face. The connection element 24 comprises a respective profile such that the connection element 24 and the ending part 28 of the holding bar 16 fit into one another.

In a first exemplary embodiment shown in FIG. 2, the ending part 28 of the holding bar 16 is formed as a profiled face. A projection 30 is formed in a central part of a front surface of the ending part 28 of the holding bar 16 and extends along a longitudinal axis 32 of the holding bar 16. The connection element 28 is of a rectangular cross section and comprises a recess 34 of a rectangular cross section in its central region. The projection 30 of the ending part 28 of the holding bar 16 is received in the recess 34 of the connection element 24 such that the package body 22 is secured against vertical and/or horizontal movement. Thus, the connecting element 24 surrounds the ending part 28 of the holding bar 16 along the total circumference of the ending part 28 of the holding bar 16.

In a second exemplary embodiment shown in FIG. 3 the ending part 28 of the holding bar 16 is formed as a recess 36 which inwardly tapers. The connection element 24 is shaped as a tip 38 which projects from the outer surface 26 of the package body 22. The form of the tip 28 is adapted to the shape of the recess 36 of the ending part 28 of the holding bar 16 such that both the tip 38 and the ending part 28 fit to one another.

The connection element 24 may be made of the same material as the encapsulation of the package body 22. Preferably, the package body 22 and the connecting element 24 are made of a plastic material or a resin. For instance, the axial length of the connection element 24 may be 50 μm to 100 μm.

As the holding bar 16 does not penetrate into the package body 22, the semiconductor chip placed in the package body 22 on the substrate is fixed on a further bar (not shown in FIG. 1) but the holding bar 16.

In the following a method for manufacturing the microelectronic package assembly 10 shown in FIG. 1 is described. First, a lead frame 12 is provided having holding bars 16 of a certain length. Semiconductor chips are placed on substrates each of which is disposed on a further bar of the lead frame 12. The substrates are located adjacent to the ending parts 28 of the holding bars 16. Next, the semiconductor chips are encapsulated in such a way that the package bodies 22 are formed with their outer surfaces 26 directly butting against the profiled front surfaces of the ending parts 28 of the holding bars 16. During the encapsulation step, the encapsulation material flows into the profile of the ending parts 28 of the holding bars 16 such that a connecting element 24 is formed at the outer surface 26 of the package body 22. Further, a specially designed tool may be used for creating a defined outline of the connecting element 24. For instance, the material of the encapsulation may be radially pressed from outside towards the ending parts 28 of the holding bars 16.

In the following a method for disconnecting a microelectronic package 14 from a lead frame 12 of the microelectronic package assembly 10 is described. This method may be applied during a singulation step of the microelectronic package assembly 10. Upon disconnecting, the lead frame 12 is bended around an axis 40 perpendicular to the longitudinal axis 32 of the holding bar 16 and/or perpendicular to a main surface of the microelectronic package assembly, e.g. out of the plane depicted in FIG. 2 or FIG. 3, resulting in a loosing and/or breaking of the ending part 28 of the holding bar 16 from the connecting element 24. Alternatively, the microelectronic packages 14 can be twisted around the longitudinal axis 32 of the holding bar 16 such that the connecting element 24 and the ending part 28 of the holding bar 16 are released from one another. Both pivotal movements induces a breakage of the connecting element 24 away from the ending part 28 of the holding bar 16 along a predetermined breaking point or breaking line at the connection zone defined by the connection element 24 and the ending part 28 of the holding bar 16. Thus, damage of the outer surface 26 of the package body 22 may be suppressed or at least reduced.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A microelectronic package assembly, comprising:
   a lead frame having a holding bar and
   a microelectronic package,
   wherein the microelectronic package comprises a package body and a connecting element for connecting the package body to the holding bar of the lead frame;
   wherein the connecting element extends from an outer surface of the package body and is engaged with an ending part of the holding bar; and
   wherein the connecting element and the ending part of the holding bar are coplanar along a longitudinal axis; and
   wherein the ending part of the holding bar comprises a recess which is shaped in an inwardly tapered way.

2. The microelectronic package assembly according to claim 1, wherein the connecting element and an encapsulation of the microelectronic package are monolithically designed.

3. The microelectronic package assembly according to claim 1, wherein the connecting element is made of a plastic or a resin.

4. The microelectronic package assembly according to claim 1, wherein two holding bars are provided for each microelectronic package, which are arranged in a diametrically offset way to one another.

5. A method for disconnecting a microelectronic package from a lead frame, the method comprising:
   providing a microelectronic package assembly including,
      a lead frame having a holding bar and
      a microelectronic package,
         wherein the microelectronic package comprises a package body and a connecting element for connecting the package body to the holding bar of the lead frame;
         wherein the connecting element extends from an outer surface of the package body and is engaged with an ending part of the holding bar;
         wherein the connecting element and the ending part of the holding bar are coplanar along a longitudinal axis;
   disconnecting the microelectronic package from the holding bar of the lead frame by disconnecting the connection element of the microelectronic package from the ending part of the holding bar of the lead frame; and
      wherein the disconnecting of the microelectronic package from the holding bar comprises pivoting the microelectronic package and the lead frame relative to one another around an axis of the holding bar.

6. The method according to claim 5, wherein the disconnecting of the microelectronic package from the holding bar comprises the step of pivoting the microelectronic package and the lead frame relative to one another around an axis being transverse to the axis of the holding bar.

* * * * *